(12) United States Patent
Ikegami

(10) Patent No.: US 9,007,081 B2
(45) Date of Patent: Apr. 14, 2015

(54) JIG FOR USE IN SEMICONDUCTOR TEST AND METHOD OF MEASURING BREAKDOWN VOLTAGE BY USING THE JIG

(75) Inventor: Masaaki Ikegami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 272 days.

(21) Appl. No.: 13/476,342

(22) Filed: May 21, 2012

(65) Prior Publication Data

US 2013/0106453 A1       May 2, 2013

(30) Foreign Application Priority Data

Nov. 1, 2011   (JP) ................................. 2011-239841

(51) Int. Cl.
  *G01R 31/00*   (2006.01)
  *G01R 1/073*   (2006.01)
  *G01R 31/12*   (2006.01)
  *G01R 31/26*   (2014.01)

(52) U.S. Cl.
  CPC .......... *G01R 1/07314* (2013.01); *G01R 31/129* (2013.01); *G01R 31/261* (2013.01); *G01R 31/2623* (2013.01)

(58) Field of Classification Search
  USPC .................................................. 324/750.19
  See application file for complete search history.

(56) References Cited

U.S. PATENT DOCUMENTS

| | | | |
|---|---|---|---|
| 5,819,410 A * | 10/1998 | Furusawa et al. ................ 29/883 |
| 7,368,927 B2 * | 5/2008 | Smith et al. .............. 324/754.07 |
| 7,782,118 B2 * | 8/2010 | Reichl et al. .................. 327/427 |
| 2002/0000821 A1 * | 1/2002 | Haga et al. ..................... 324/761 |
| 2003/0132772 A1 * | 7/2003 | Liao et al. ..................... 324/757 |
| 2004/0088855 A1 * | 5/2004 | Akram ............................. 29/840 |
| 2005/0184744 A1 * | 8/2005 | Schwindt et al. ............. 324/754 |
| 2006/0038172 A1 * | 2/2006 | Akram ............................ 257/48 |
| 2006/0043477 A1 * | 3/2006 | Akram ........................... 257/337 |
| 2008/0297184 A1 * | 12/2008 | Miura et al. ................... 324/754 |
| 2009/0174427 A1 * | 7/2009 | Weinraub et al. ............. 324/765 |

(Continued)

FOREIGN PATENT DOCUMENTS

| | | |
|---|---|---|
| CN | 101718835 A | 6/2010 |
| CN | 102798738 A | 11/2012 |

(Continued)

OTHER PUBLICATIONS

Korean Office Action issued Sep. 27, 2013, in Korea Patent Application No. 10-2012-0118843 (with English translation).

(Continued)

*Primary Examiner* — Benjamin M Baldridge
(74) *Attorney, Agent, or Firm* — Oblon, McClelland, Maier & Neustadt, L.L.P.

(57) ABSTRACT

A jig for use in a semiconductor test of the present invention includes; a base on which a probe pin and an insulating material are provided such that the probe pin is surrounded by the insulating material in plan view; and a stage arranged to face a surface of the base on which the probe pin and the insulating material are provided. The stage is capable of receiving a test object placed on a surface facing the base. When the test object is placed on the stage and the base and the stage move in a direction in which they get closer to each other, the probe pin comes into contact with an electrode formed on the test object, and the insulating material comes into contact with both the test object and the stage.

13 Claims, 5 Drawing Sheets

(56) References Cited

U.S. PATENT DOCUMENTS

| | | |
|---|---|---|
| 2011/0018565 A1 | 1/2011 | Yiang et al. |
| 2012/0126841 A1 * | 5/2012 | Yamada et al. .......... 324/750.19 |

FOREIGN PATENT DOCUMENTS

| | | |
|---|---|---|
| JP | 10-253660 | 9/1998 |
| JP | 2001-051011 A | 2/2001 |
| JP | 2003-100819 | 4/2003 |
| JP | 2005-207861 A | 8/2005 |
| JP | 2006-337247 | 12/2006 |
| JP | 2007-225501 A | 9/2007 |
| JP | 2009-47512 | 3/2009 |
| JP | 2010-10306 | 1/2010 |
| JP | 4482061 | 3/2010 |
| JP | 2010-256255 | 11/2010 |
| JP | 2011-199306 A | 10/2011 |
| JP | 2012-247196 A | 12/2012 |
| KR | 10-2001-0010503 | 2/2001 |
| KR | 10-2011-0015902 | 2/2011 |
| WO | WO 2010/021070 A1 | 2/2010 |

OTHER PUBLICATIONS

U.S. Appl. No. 13/368,558, filed Feb. 8, 2012, Kaguchi, et al.
Office Action issued May 27, 2014 in Japanese Patent Application No. 2011-239841 (with English language translation).
Chinese Office Action issued on Oct. 10, 2014, in Chinese Application No. 2012102005176 (with partial English translation.).

* cited by examiner

F I G . 1
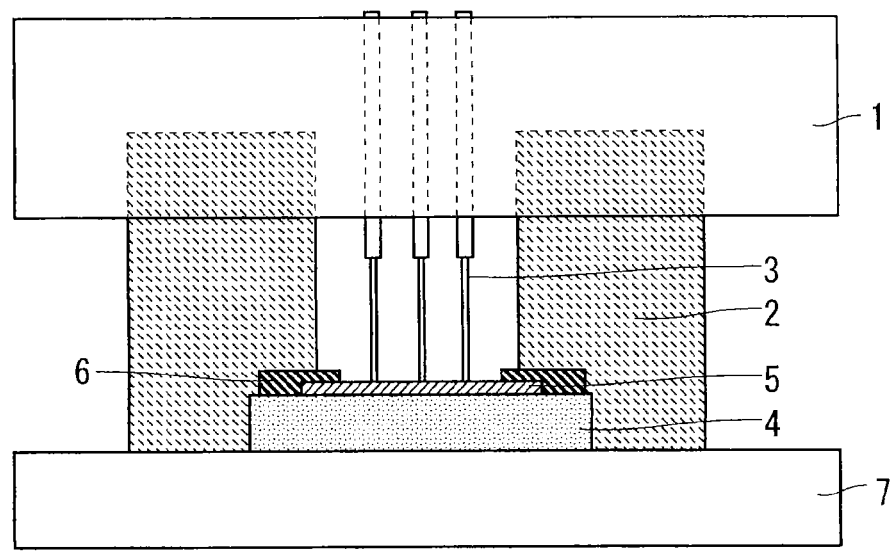

JIG FOR USE IN SEMICONDUCTOR TEST AND METHOD OF MEASURING BREAKDOWN VOLTAGE BY USING THE JIG

BACKGROUND OF THE INVENTION

1. Field of the Invention

The present invention relates to a jig for use in a semiconductor test and a method of measuring a breakdown voltage by using the jig. More specifically, the present invention relates to a jig for use in a semiconductor test and method of measuring a breakdown voltage by using the jig that are suitably applicable for measuring the breakdown voltage of a wide bandgap semiconductor.

2. Description of the Background Art

A power semiconductor device using a wide bandgap semiconductor being a semiconductor with a high breakdown voltage is subjected to measurement of electrical characteristics (hereinafter also called a test) when the power semiconductor device is in the form of a chip and has not been implemented on a package. Measurement items of electrical characteristics include measurement of a breakdown voltage. A breakdown voltage is considered as one of important indicators of performances, and should always be measured.

The electrical characteristics of a chip of a power semiconductor device (hereinafter also called a semiconductor chip) with a high breakdown voltage are generally measured in the conventional system as follows, for example. In this system, a probe pin comes into contact with a surface of a semiconductor chip placed on a stage and then a voltage is applied, thereby testing (measuring) electrical characteristics (see Japanese Patent Application Laid-Open No. 2006-337247 (FIG. 10), for example). In a different system of measuring the electrical characteristics of a semiconductor wafer (chip), the semiconductor wafer is dipped into an insulation solution (see Japanese Patent Application Laid-Open No. 2003-100819 and Japanese Patent Publication No. 4482061, for example).

A power semiconductor device with a high breakdown voltage has a breakdown voltage of several hundred volts, and a distance between an electrode formed on a semiconductor chip and an edge portion of the chip is short. So, in the system of Japanese Patent Application Laid-Open No. 2006-337247, if a high voltage is applied to the probe pin contacting a surface electrode on the semiconductor chip and to the stage contacting a back electrode on the semiconductor chip for measurement of the breakdown voltage of the semiconductor chip, insulation breakdown is generated between the surface electrode on the semiconductor chip and the stage. This generates discharge in atmosphere (atmosphere discharge or creeping discharge), leading to a problem of breakage of the semiconductor chip and breakage of a power supply of the measuring system.

Atmosphere discharge is affected by a creeping distance, air clearance, humidity, temperature and pressure of atmosphere, moisture absorption with a protective film formed on a surface of a semiconductor chip, and the like. So, generation of atmosphere discharge makes it impossible to measure a breakdown voltage accurately. As a result, even a semiconductor chip with inaccurate breakdown voltage characteristics cannot be evaluated (breakdown voltage thereof cannot be measured accurately) before the semiconductor chip is assembled into a package. This leads to serious reduction in measurement efficiency.

Materials of a wide bandgap semiconductor such as silicon carbide and gallium nitride have an insulation breakdown electric field of one order of magnitude greater than that of silicone. This makes it possible to shrink a terminal structure of a chip provided to maintain a breakdown voltage securely. As a result of shrinkage of the terminal structure, the insulation breakdown electric field of atmosphere extending from an opening edge of a protective film formed at a terminal portion to an edge portion of a chip is made smaller than insulation breakdown electric field in bulk, leading to a problem in that creeping discharge is generated easily. There has also been a problem in that discharge easily damages a gate oxide film of a semiconductor device having an MOS (metal-oxide semiconductor) structure.

The techniques suggested in Japanese Patent Application Laid-Open No. 2003-100819 and Japanese Patent Publication No. 4482061 are intended to avoid influence on a semiconductor chip exerted by the aforementioned discharge. However, these techniques involve a unit for supply and drainage of an insulation solution. This entails costs so the electrical characteristics of a semiconductor chip cannot be measured at low cost.

SUMMARY OF THE INVENTION

It is an object of the present invention to provide a jig for use in a semiconductor test and a method of measuring a breakdown voltage by using the jig that are capable of measuring the breakdown voltage of a semiconductor chip at low cost without generating atmosphere discharge.

The jig for use in a semiconductor test of the present invention includes; a base on which a probe pin and an insulating material are provided such that the probe pin is surrounded by the insulating material in plan view; and a stage arranged to face a surface of the base on which the probe pin and the insulating material are provided. The stage is capable of receiving a test object placed on a surface facing the base. When the test object is placed on the stage and the base and the stage move in a direction in which they get closer to each other, the probe pin comes into contact with an electrode formed on the test object, and the insulating material comes into contact with both the test object and the stage.

In the present invention, when a test object is placed on a stage and a jig base and a stage move in a direction in which they get closer to each other, a probe pin comes into contact with an electrode formed on the test object, and an insulating material comes into contact with both the test object and the stage. Thus, the breakdown voltage of a semiconductor chip can be measured at low cost without generating atmosphere discharge.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows an exemplary structure of a jig for use in a semiconductor test of a first preferred embodiment of the present invention;

EMBODIMENT FOR CARRYING OUT THE INVENTION

Figure 2:
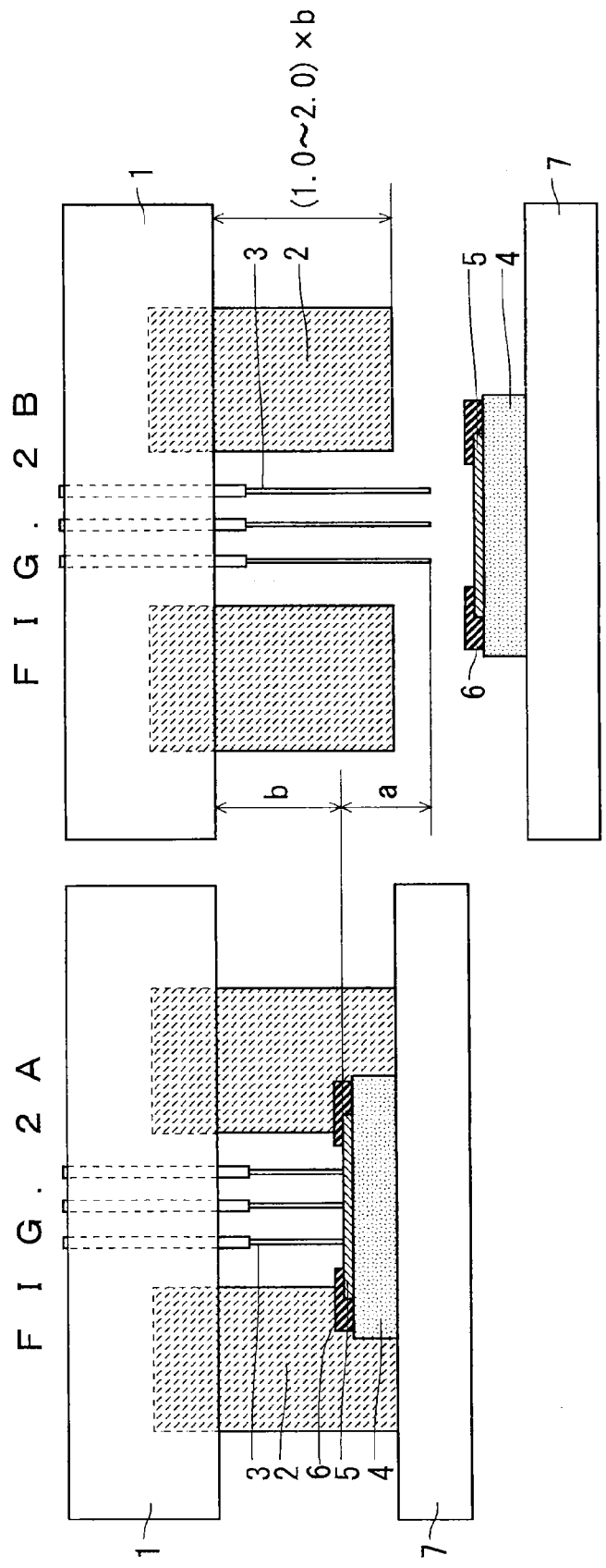
FIGS. 2A and 2B each show an exemplary structure of the jig for use in a semiconductor test of the first preferred embodiment of the present invention.

Preferred embodiments of the present invention are described below by referring to the drawings.

Prerequisite Technique

A technique prerequisite to the present invention (prerequisite technique) is described first.

Figure 7:
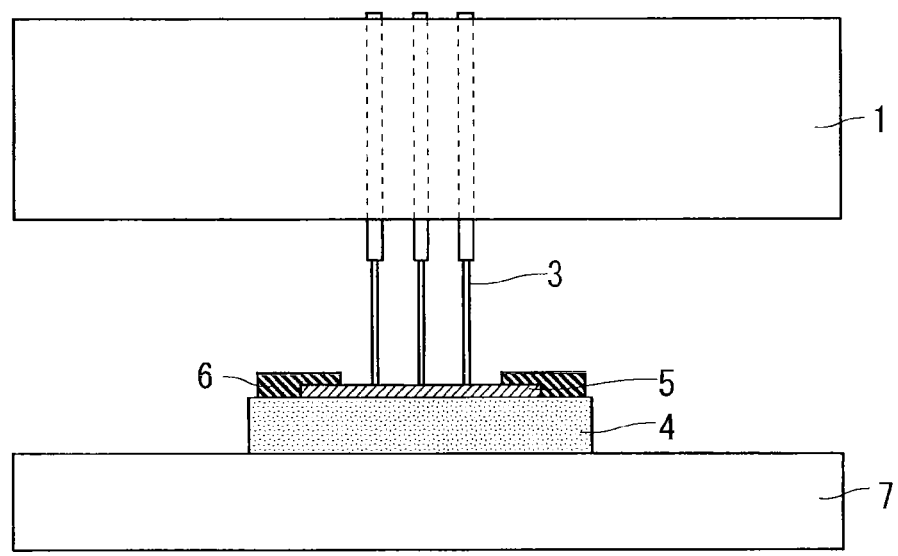
FIG. 7 shows an exemplary structure of a jig for use in a semiconductor test of a prerequisite technique.

FIG. 7 shows an exemplary structure of a jig for use in a semiconductor test of the prerequisite technique. As shown in FIG. 7, the jig for use in a semiconductor test of the prerequisite technique includes a susceptor 1 (jig base), probe pins 3, and a lower electrode stage (stage) 7. The probe pins 3 are provided to the susceptor 1, and a semiconductor chip 4 (test object) on which a protective film 6 is formed in a terminal portion thereof is placed on the lower electrode stage 7. FIG. 7 shows a condition where the semiconductor chip 4 is subjected to measurement of a breakdown voltage (subjected to test). For measurement of a breakdown voltage, the probe pins 3 contact a surface electrode 5 formed on a surface of the semiconductor chip 4.

In the jig for use in a semiconductor test of the prerequisite technique shown in FIG. 7, if the protective film 6 formed on the terminal portion of the semiconductor chip 4 shrinks, an insulation distance between the surface electrode 5 and a surface of the lower electrode stage 7 facing the susceptor 1 is shortened. This results in a problem of generation of discharge at the terminal portion of the semiconductor chip 4.

The present invention described in detailed below has been made to solve the aforementioned problem.

First Preferred Embodiment

FIG. 1 shows an exemplary structure of a jig for use in a semiconductor test of a first preferred embodiment of the present invention. FIG. 1 shows a condition where measurement of a breakdown voltage (test) is performed by using the jig for use in a semiconductor test of the first preferred embodiment. As shown in FIG. 1, the jig for use in a semiconductor test of the first preferred embodiment includes a susceptor 1 (jig base) on which probe pins 3 and an insulating material 2 are provided such that the probe pins 3 are surrounded by the insulating material 2 having a hollow structure in plan view, and a lower electrode stage 7 (stage) arranged to face a surface of the susceptor 1 on which the probe pins 3 and the insulating material 2 are provided and which is capable of receiving a semiconductor chip 4 (test object) placed on a surface facing the susceptor 1. A surface electrode 5 is formed on a surface (surface facing the susceptor 1) of the semiconductor chip 4, and a protective film 6 is provided on a terminal portion of the semiconductor chip 4.

A method of measuring a breakdown voltage by using the jig for use in a semiconductor test shown in FIG. 1 is described below.

First, the semiconductor chip 4 is placed on the lower electrode stage 7. As shown in FIG. 1, placing the semiconductor chip 4 on the lower electrode stage 7 makes a back electrode on the semiconductor chip 4 (electrode not shown in the drawings opposite the surface electrode 5) and the lower electrode stage 7 contact each other.

Next, the susceptor 1 and the lower electrode stage 7 move in a direction in which they get closer to each other. This makes the probe pins 3 contact the surface electrode 5 on the semiconductor chip 4 and at the same time, presses the insulating material 2 against the semiconductor chip 4 and the lower electrode stage 7 sequentially to make the insulating material 2 contact both the semiconductor chip 4 and the lower electrode stage 7. In FIG. 1, the probe pins 3 contact the surface electrode 5 on the semiconductor chip 4. Further, the insulating material 2 contacts the protective film 6 on the semiconductor chip 4, a side surface of the semiconductor chip 4 continuous with a surface of the semiconductor chip 4 on which the protective film 6 is formed, and the lower electrode stage 7. The semiconductor chip 4 has a thickness of about 40 to 500 μm. Then, a high voltage is applied to the probe pins 3 and the lower electrode stage 7 to measure the breakdown voltage of the semiconductor chip 4, thereby testing the breakdown voltage characteristics of the semiconductor chip 4.

The insulating material 2 used in the aforementioned measurement of the breakdown voltage of the semiconductor chip 4 may have hardness of from 5 to 30 measured with a type E durometer in compliance with JISK6253 and have high insulation properties. Defining the hardness of the insulating material 2 in this way makes it possible to remove a damage on the semiconductor chip 4 due to stress applied thereon. The elastic force of the insulating material 2 is used to make the insulating material 2 tightly contact the protective film 6, the side surface of the semiconductor chip 4, and the lower electrode stage 7.

The thickness of the insulating material 2 (length of part of the insulating material 2 projecting from the susceptor 1) may be in a range of from a level being the same as or greater than a difference between the length of part of the probe pins 3 projecting from the susceptor 1 and the pressed amount (stroke) of the probe pins 3 to a level twice the difference. FIG. 2A shows a condition where a breakdown voltage is measured (test is conducted), and FIG. 2B shows a condition where a breakdown voltage is not measured (test is not conducted). As shown in FIG. 2B, assuming that the length of part of the probe pins 3 projecting from the susceptor 1 is a+b and the pressed amount of the probe pins 3 is a, the thickness of the insulating material 2 is expressed as (1.0 to 2.0)×b. In the first preferred embodiment, the thickness of the insulating material 2 is from about 2.5 to about 8.5 mm. Defining the thickness of the insulating material 2 in this way makes it possible to prevent damage on the semiconductor chip 4 due to stress applied thereon.

The length of the probe pins 3 (length of part of the probe pins 3 projecting from the susceptor 1) may be from 3.0 to 10.00 mm, and the pressed amount (stroke) of the probe pins 3 may be from 0.5 to 6.0 mm. Defining the length and the pressed amount of the probe pins 3 in this way makes it possible to remove a damage on the semiconductor chip 4 due to stress applied thereon.

As described above, during measurement of the breakdown voltage of a chip (semiconductor chip 4) before the chip is implemented on a package, the insulating material 2 contacts the semiconductor chip 4 and the lower electrode stage 7, thereby separating the surface electrode 5 on the semiconductor chip 4 and the lower electrode stage 7 from each other. This lengthens an insulation distance between the surface electrode 5 on the semiconductor chip 4 and the lower electrode stage 7, so that a breakdown voltage can be measured without generating atmosphere discharge (creeping distance)

if the breakdown voltage does not exceed a level of about 10 kV. Further, a breakdown voltage can be measured at lower cost than a system using an insulation solution.

In the first preferred embodiment, regarding the movement of the susceptor 1 and the lower electrode stage 7 in a direction in which they get closer to each other, the susceptor 1 may move down while the lower electrode stage 7 is fixed. In other cases, the lower electrode stage 7 may move up while the susceptor 1 is fixed, or both the susceptor 1 and the lower electrode stage 7 may move down and up.

The probe pins 3 may be spring probes (see Japanese Patent Application Laid-Open No. 10-253660 (1998), for example), wire probes (see Japanese Patent Application Laid-Open No. 2009-47512, for example), or probes of a stacked structure (see Japanese Patent Application Laid-Open No. 2010-256255, for example). The probe pins 3 may be any of these probes as long as they are vertical probes.

The insulating material 2 is made of a material that is any one of a silicone-based (dimethylformamide) rubber, an organic polymer (such as polytetrafluoroethylene), and an organic-inorganic hybrid polymer. Using these materials provides resistance to high temperature of about 250 degrees, so that the insulating material 2 can be used in a test conducted at high temperature.

The insulating material 2 may be given a thin film coating on a surface facing the semiconductor chip 4 and the lower electrode stage 7. As an example, the insulating material 2 of a thickness determined in the aforementioned way has tackiness (adhesiveness), and cannot be separated well from the semiconductor chip 4 and the lower electrode stage 7 (namely, the insulating material 2 has high adhesiveness) after a test is finished. If a thin film coating is provided on the insulating material 2, the insulating material 2 contacts the semiconductor chip 4 and the lower electrode stage 7 tightly during a test, while the insulating material 2 is separated well from the semiconductor chip 4 and the lower electrode stage 7 after the test is finished (namely, adhesiveness of the insulating material 2 is reduced). The thin film coating may be made of a silicone-based or urethane-based material.

Figure 3:
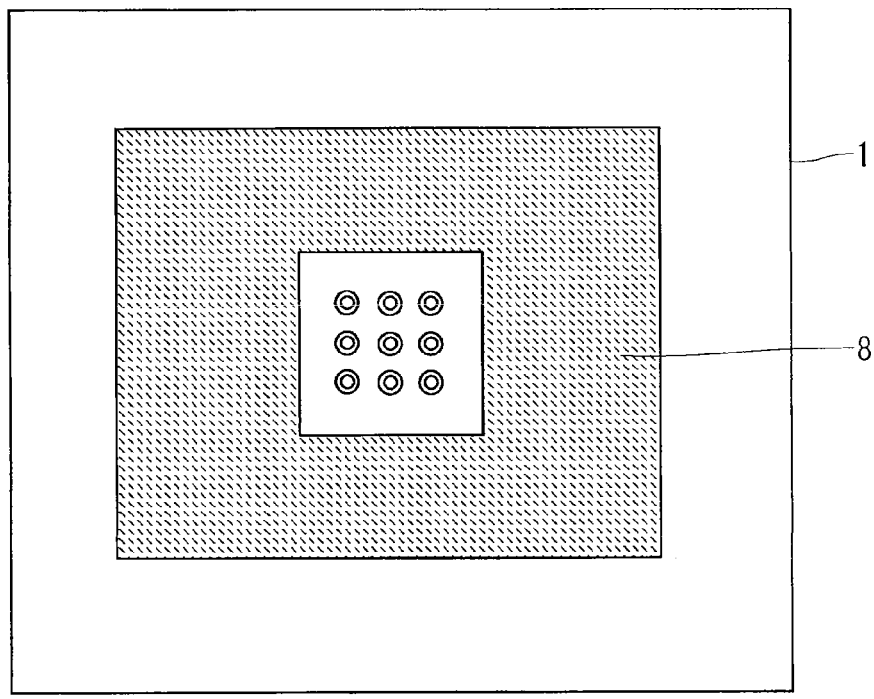
FIG. 3 shows an exemplary shape of a susceptor of the first preferred embodiment of the present invention.

As shown in FIG. 3, the susceptor 1 may be given a counterbored opening 8 of a shape corresponding to the shape of the insulating material 2. To be specific, the susceptor 1 may be given an opening to define the position of the insulating material 2. Providing the counterbored opening 8 makes it possible to attach and detach the insulating material 2 to and from the susceptor 1 more easily and more precisely than the case where the insulating material 2 is placed on a plane with no counterbored opening 8. As a result, the maintenance (exchange of the insulating material) of the jig for use in a semiconductor test of the first preferred embodiment is conducted more efficiently.

The jig for use in a semiconductor test of the first preferred embodiment is used effectively if the semiconductor chip 4 is made of a wide bandgap semiconductor such as silicon carbide (SiC) and gallium nitride (GaN). During a test for a wide bandgap semiconductor having a shrunken terminal structure, discharge is generated easily in response to application of a high voltage to the wide bandgap semiconductor. The jig for use in a semiconductor test of the first preferred embodiment is used effectively particularly in such a case.

The first preferred embodiment describes the method of measuring a breakdown voltage by using the jig for use in a semiconductor test. Meanwhile, the jig for use in a semiconductor test is applicable not only for measurement of a breakdown voltage but also for measurement of other electrical characteristics of a chip before the chip is implemented on a package.

Second Preferred Embodiment

Figure 4:
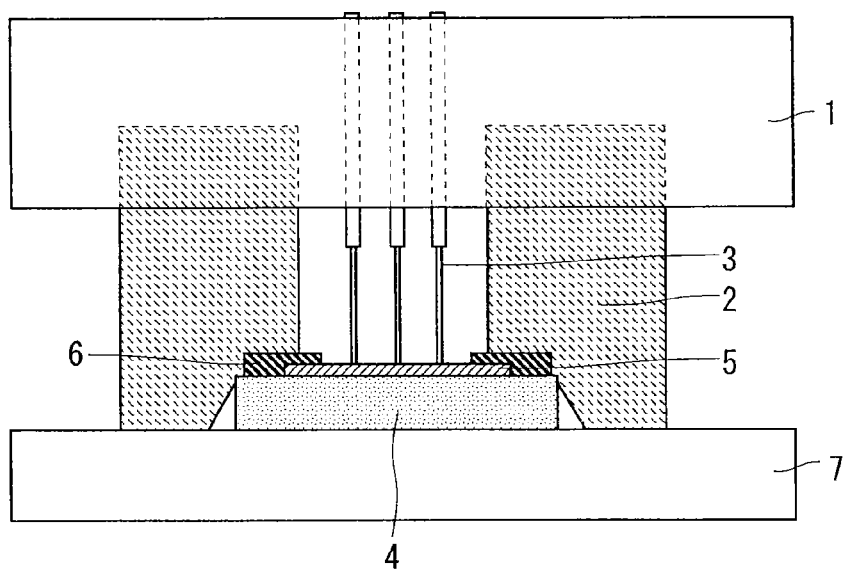
FIG. 4 shows an exemplary structure of a jig for use in a semiconductor test of a second preferred embodiment of the present invention.

FIG. 4 shows an exemplary structure of a jig for use in a semiconductor test of a second preferred embodiment of the present invention. FIG. 4 shows a condition where a breakdown voltage is measured (test is conducted) by using the jig for use in a semiconductor test of the second preferred embodiment.

As shown in FIG. 4, in the jig for use in a semiconductor test of the second preferred embodiment, an insulating material 2 contacts a surface of a semiconductor chip 4 (test object) facing a susceptor 1 (jig base), at least part of a side surface of the semiconductor chip 4 continuous with this surface (in FIG. 4, upper part of the side surface), and a lower electrode stage 7 (stage). To be specific, in the jig for use in a semiconductor test of the second preferred embodiment, space is formed between the insulating material 2 and the side surface of the semiconductor chip 4 during a test. The structure and the operation of the jig for use in a semiconductor test of the second preferred embodiment are the same in other respects as those of the first preferred embodiment, so they will not be described again.

Even if the space is formed between the insulating material 2 and the side surface of the semiconductor chip 4 during a test, the second preferred embodiment still achieves the same effect as that of the first preferred embodiment.

Third Preferred Embodiment

Figure 5:
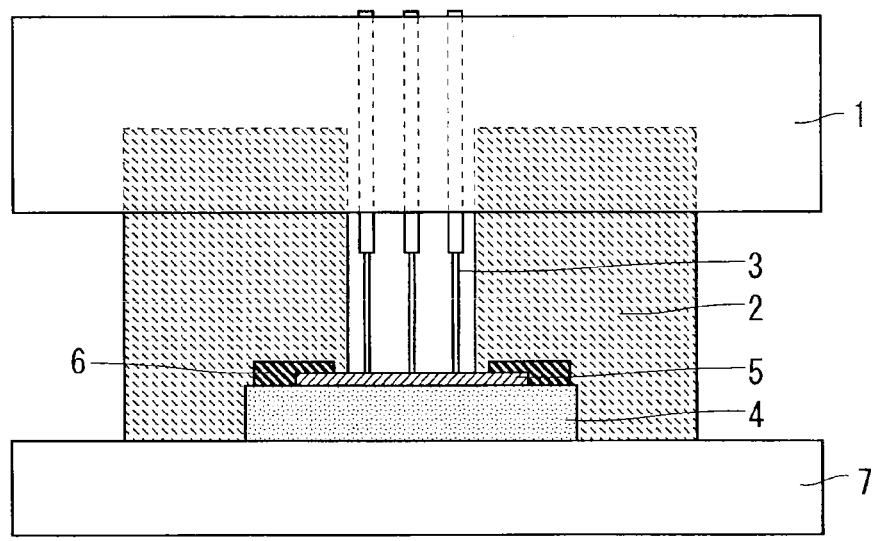
FIGS. 5 and 6 each show an exemplary structure of a jig for use in a semiconductor test of a third preferred embodiment of the present invention.
Figure 6:
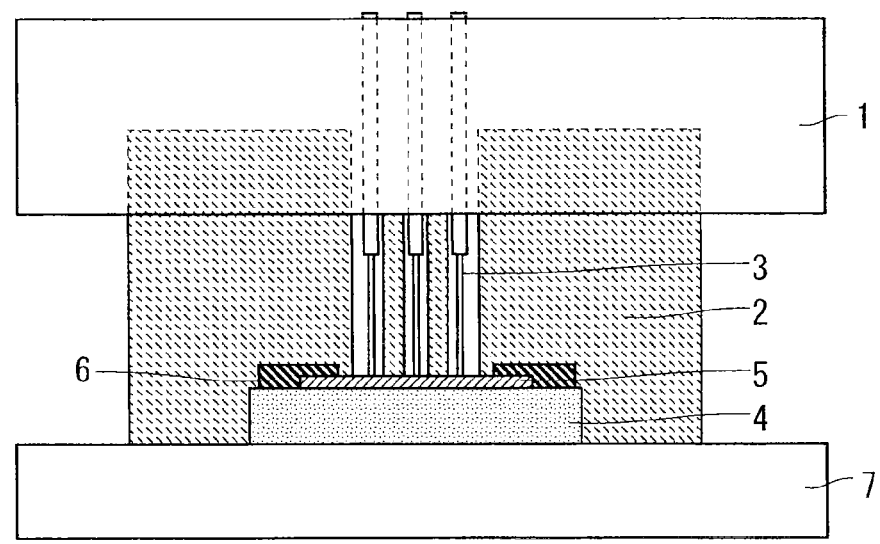

FIGS. 5 and 6 each show an exemplary structure of a jig for use in a semiconductor test of a third preferred embodiment of the present invention. FIGS. 5 and 6 each show a condition where a breakdown voltage is measured (test is conducted) by using the jig for use in a semiconductor test of the third preferred embodiment.

As shown in FIG. 5, an insulating material 2 contacts a protective film 6, a side surface of a semiconductor chip 4, and a lower electrode stage 7. The insulating material 2 additionally contacts outer circumferential part of a surface electrode 5. Further, as shown in FIG. 6, probe pins 3 are surrounded by the insulating material 2 of a solid structure in plan view. To be specific, in the jig for use in a semiconductor test of the third preferred embodiment, the insulating material 2 additionally contacts the surface electrode 5 on the semiconductor chip 4 as shown in FIGS. 5 and 6. The structure and the operation of the jig for use in a semiconductor test of the third preferred embodiment are the same in other respects as those of the first preferred embodiment, so they will not be described again.

Even if the insulating material 2 contacts the surface electrode 5 on the semiconductor chip 4 during a test, the third preferred embodiment still achieves the same effect as that of the first preferred embodiment.

The preferred embodiments of the present invention can be combined freely, and each of the preferred embodiments can be modified or omitted where appropriate without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:
1. A jig for measuring a breakdown voltage of a semiconductor test object, comprising:

a jig base on which a probe pin and an insulating material are provided such that said probe pin is surrounded by said insulating material in plan view; and a stage arranged to face a surface of said jig base on which said probe pin and said insulating material are provided, the stage being capable of receiving the semiconductor test object placed on a surface facing said jig base, wherein when said semiconductor test object is placed on said stage and said jig base and said stage move in a direction in which they get closer to each other, said probe pin comes into contact with an electrode formed on said semiconductor test object to measure a breakdown voltage of the semiconductor test object, and said insulating material comes into contact with both said semiconductor test object and said stage.

2. The jig for measuring a breakdown voltage of a semiconductor test object according to claim 1, wherein said insulating material contacts a surface of said test object facing said jig base, at least part of a side surface of said semiconductor test object continuous with said surface of said semiconductor test object, and said stage.

3. The jig for measuring a breakdown voltage of a semiconductor test object according to claim 1, wherein said insulating material has hardness of from 5 to 30 measured with a type E durometer in compliance with JISK6253.

4. The jig for measuring a breakdown voltage of a semiconductor test object according to claim 1, wherein the length of part of said insulating material projecting from said jig base is in a range of from a level being the same as or greater than a difference between the length of part of said probe pin projecting from said jig base and the stroke of said probe pin to a level twice the difference.

5. The jig for measuring a breakdown voltage of a semiconductor test object according to claim 1, wherein the length of part of said probe pin projecting from said jig base is from 3.0 to 10.00 mm, and the stroke of said probe pin is from 0.5 to 6.0 mm.

6. The jig for measuring a breakdown voltage of a semiconductor test object according to claim 1, wherein said probe pin is a vertical probe comprising a spring probe, a wire probe, or a probe of a stacked structure.

7. The jig for measuring a breakdown voltage of a semiconductor test object according to claim 1, wherein said insulating material is made of a material that is any one of a silicone-based rubber, an organic polymer, and an organic-inorganic hybrid polymer.

8. The jig for measuring a breakdown voltage of a semiconductor test object according to claim 1, wherein said insulating material is given a thin film coating on a surface facing said test object and said stage.

9. The jig for measuring a breakdown voltage of a semiconductor test object according to claim 8, wherein said thin film coating is made of a silicone-based or urethane-based material.

10. The jig for measuring a breakdown voltage of a semiconductor test object according to claim 1, wherein said jig base is given an opening defining the position of said insulating material.

11. The jig for measuring a breakdown voltage of a semiconductor test object according to claim 1, wherein said semiconductor test object is made of a wide bandgap semiconductor.

12. A method of measuring a breakdown voltage using a jig in a semiconductor test, the jig comprising a jig base on which a probe pin and an insulating material are provided such that said probe pin is surrounded by said insulating material in plan view, and a stage arranged to face a surface of said jig base on which said probe pin and said insulating material are provided, the stage being capable of receiving a semiconductor test object placed on a surface facing said jig base, the method comprising:

placing said test object on said stage;

after placing said semiconductor test object on said stage, causing said jig base and said stage to move in a direction in which they get closer to each other to make said probe pin contact an electrode formed on said semiconductor test object;

pressing said insulating material against said semiconductor test object and said stage sequentially to make said insulating material contact both said test object and said stage; and measuring the breakdown voltage of said semiconductor test object by applying a voltage to said probe pin and said stage.

13. The method of measuring a breakdown voltage according to claim 12, wherein in said pressing, said insulating material is pressed against a surface of said semiconductor test object facing said jig base, at least part of a side surface of said semiconductor test object continuous with said surface of said test object facing said jig base, and said stage sequentially to make said insulating material contact said surface of said semiconductor test object facing said jig base, said side surface, and said stage.

* * * * *